United States Patent [19]
Stemke

[11] 3,717,041
[45] Feb. 20, 1973

[54] ADJUSTING DEVICE FOR TUNER UNITS

[75] Inventor: Lothar Stemke, Rottweil, Germany

[73] Assignee: Hopt Electronic GmbH, Rottweil, Germany

[22] Filed: Sept. 1, 1971

[21] Appl. No.: 177,012

[30] Foreign Application Priority Data

Sept. 4, 1970 Germany....................P 20 43 979.6

[52] U.S. Cl.....................................................74/10.6
[51] Int. Cl.....................................................F16h 35/18
[58] Field of Search....................................74/10.6

[56] References Cited

UNITED STATES PATENTS 2,484,331 10/1949 Bels....................................74/10.6
3,675,496 7/1972 Atsuhkro et al.......................74/10.6

*Primary Examiner*—Milton Kaufman
*Assistant Examiner*—Wesley S. Ratliff, Jr.
*Attorney*—Craig, Antonelli & Hill

[57] ABSTRACT

A tuner unit particularly for television receivers has an adjusting device comprising a plurality of tuning spindles mounted preferably in an indexable rotatable drum for displacement relating to an adjuster shaft an end of which can be moved into engagement with an end of any one of the tuning spindles by longitudinal displacement of the shaft, for the purpose of setting any one of the spindles to a selected tuning portion to be stored. A further tuning spindle is provided which is displaceable into operative connection with the adjuster shaft in the next portion of the latter, whereby the further tuning spindle can be adjusted to any one of a continuous band of tuning positions.

9 Claims, 1 Drawing Figure

PATENTED FEB 20 1973
3,717,041
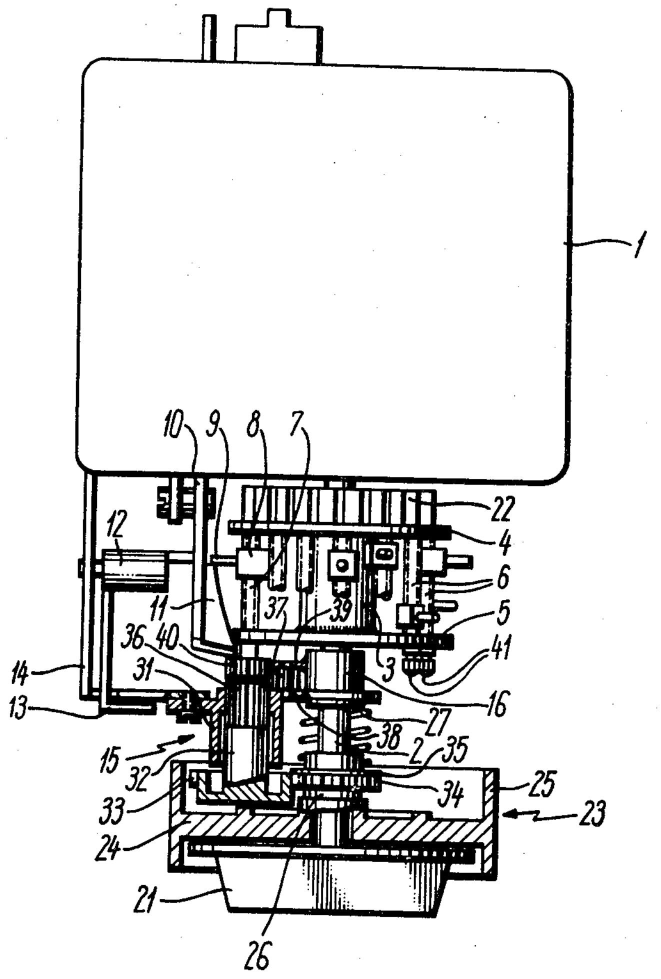
INVENTOR
LOTHAR STEMKE
BY Craig, Antonelli & Hill
ATTORNEYS

ADJUSTING DEVICE FOR TUNER UNITS

This invention relates to an adjusting device for tuner units, in particular a tuner unit for a television receiver, having a plurality of tuning spindles which are disposed in a casing and each of which is provided at one end with a coupling member, an adjuster shaft which is displaceable in its longitudinal direction and which is also provided at its end adjacent to the tuning spindles with a coupling member which can be moved into engagement with the coupling member of an associated tuning spindle by displacement of the adjuster shaft from a rest position into an operative position, and an arrangement for producing a relative movement between the adjuster shaft and the tuning spindles by means of which a co-ordination can be produced between the adjuster shaft and a desired one of the tuning spindles.

Adjusting devices for tuner units are known in which the tuning spindles are mounted in a rotatable drum and can be moved by rotation into an operative position in which they come into engagement with the tuning members of the tuner unit and also come into the region of an adjuster shaft. In this case, either the ends of the tuning spindles or alternatively adjuster members associated with the tuning spindles can come into engagement with mechanical tuning members of the tuner unit, or the tuning spindle can be the adjuster spindle of a rectilinear potentiometer which in the operative position of the tuning spindle is switched into a tuning circuit of the tuner unit. In all these arrangements, the tuning position for any desired transmitter can be stored by means of the tuning spindle, such position being necessarily set when the respective spindle is moved into its operative position. A change of the adjustment of the tuning spindle is necessary only when the pre-set channel is to be changed. The adjuster shaft is in operative connection with an adjuster knob and has the purpose of making such change of the pre-set channel possible. Since however, a change of the pre-set frequency must not occur unintentionally the adjuster shaft must not come unintentionally into engagement with the respective tuning spindle which is in the operative position, in order that unintentional displacement of the tuning spindle is avoided with certainty.

If such adjusting devices for tuner units have to retain an acceptable size the possible number of tuning spindles and thus the possible number of pre-set channels is limited. Therefore, it may occur quite easily that in favorable reception areas considerably more channels are received than can be stored in such adjusting device. The demand exists then that additionally to the stored channels other channels not stored can also be received without the existing storage being cancelled. Such demand exists already in the USA where in favorable locations eight and more different television transmissions can be received, whereas adjusting devices of the kind referred to above, which are to be inserted preferably in portable receivers and must therefore be extremely compact, comprise rarely more than six tuning spindles. The invention is therefore based on the problem of constructing an adjusting device of the kind referred to above in such manner that a possibility exists for tuning through the whole receiving range without the need for altering the stored adjustments and without it being necessary to hold the tuning shaft continuously in a depressed position during tuning through the receiving range which would be extremely inconvenient Furthermore, no additional tuning elements should be provided which would considerably complicate the construction of such adjusting device.

A similar problem exists e.g. in radio receivers which have pre-set station buttons the number of which must necessarily be much smaller than the number of the transmitters lying normally within the range of reception. In the known push-button units as used in particular in car radios, a separate tuning knob is present by means of which the receiver can be tuned continuously. The tuning device of the receiver comprises a rocker member the angular position of which as well as the position of the adjusting knob determine the adjusted frequency. An adjustable abutment attached to each push button comes into engagement with the rocker member when a button is depressed and moved the rocker member into an angular position determined by the abutment. After depressing the push-button returns into a position in which the rocker member is free of the abutment so that the adjustment can be changed at any time by means of the adjusting knob. Such arrangement, however, is not applicable to adjusting devices of the kind referred to above, because in this case the tuning spindles remain in some way continuously in engagement with the tuning members of the tuner unit, so that a change of the tuning can be effected only by an actuation of the tuning spindles. Therefore the push-button units known from radio raceivers do not lead to the solution of the problem discussed above.

According to the invention, this problem is solved in that in an adjusting device of the kind described above, at least one further tuning spindle is provided which when association with the adjuster shaft is established is already coupled to the adjuster shaft which is located in the basic position.

In the adjusting device according to the invention, therefore, a further tuning spindle is present additionally to the tuning spindles by each of which always one pre-set channel is stored and displacement of which is only possible in that the adjuster shaft is depressed in particular by means of the adjuster button for actuating such tuning spindle, which further tuning spindle is not intended for storing a channel and accordingly comes into direct engagement with the adjuster shaft when it has been moved into its operative position. By means of this directly coupled tuning spindle the whole receiving range can then be tuned through in order to detect whether perhaps a better program is present on any not stored channels than on the channels stored by means of the other tuning spindles. The particular advantage of the invention resides in the fact that no additional space consuming members of any kind are required but that one of the tuning spindles present in any case can be used for this purpose and that tuning through the whole range is possible in a simple manner by means of the same tuning knob which can be used also for changing the preselected channels.

In a further development of the invention, the adjuster shaft may be provided at its end with a gear wheel which when the association has been effected is in operative connection with a gear wheel located at one end of the further tuning spindle. If in this embodiment of the invention the adjuster shaft is laterally offset relatively to the respective tuning spindle located in its operative position it would be sufficient to dispose the gear wheel at the end of the further tuning spindle in such position in which it comes into direct engagement with the gear wheel at the end of the adjuster shaft, whereas the other tuning spindles are provided with gear wheels which are located at a certain axial spacing from the gear wheel on the adjuster shaft, so that an engagement with the adjuster shaft is possible only by depressing the adjuster shaft. However, the risk exists that upon depression of the adjuster shaft the teeth of the axially mutually offset gear wheels seat on each other and that during the rotation which is necessary for bringing the teeth into mesh, just such unintentional displacement of the tuning spindles occurs which is to be avoided.

Therefore, a further embodiment of the invention provides that the adjuster shaft is disposed in line with the associated tuning shaft and is in operative connection with the gear wheel disposed at the end of the further shaft by way of an offset pinion. This arrangement then permits the ends of the tuning spindles other than the end of the further tuning spindle to have a non-circular, in particular star-shaped cross-section by means of which they are able to engage in the manner of a key into a corresponding recess at the end of the adjuster shaft facing them. In such embodiment of the invention the ends of the tuning spindles may be e.g. star-like in the manner of a cross headed screw driver and engage in a corresponding cross-pattern slot at the end of the adjuster shaft when this adjuster shaft is depressed in the direction towards the tuning spindles. Such shape matching interengaging coupling members can be easily produced, slide automatically into each other and ensure at the same time a good transfer of torque.

In a preferred embodiment of the invention the adjuster shaft is disposed eccentrically of an adjuster knob and is in driving connection with the adjuster knob by means of gear wheels. Such arrangement is particularly space saving and in particular permits the provision of a collar at the edge of the adjuster knob and the disposition of the adjuster shaft in the region between this collar and the rotary axis of the adjuster knob. In this case, the end of the adjuster shaft remote from the tuning spindles can rest against the adjacent face of the knob and can be driven by this knob when this knob is displaced in the direction of the adjuster shaft to produce a connection with a tuning spindle. When the adjuster shaft is disposed opposite the further tuning spindle by means of which a connection is produced by way of a gear wheel drive, the end of this further tuning spindle provided with this gear wheel can prevent a depression of the adjuster shaft and thereby also of the adjuster knob.

As referred to already above, the tuning spindles may be disposed in a rotatable drum. It is also possible to mount the adjuster knob in a particularly simple manner on the drum axis which is provided with a selector knob.

Further details and constructional features of the invention may be seen from the following description in which the invention is described and explained in detail with reference to a constructional example illustrated in the accompanying drawing. The features which may be taken from the description and the drawing may be used in other embodiments of the invention individually by themselves or severally in any combination. The drawing illustrates a longitudinal section through an adjusting device according to the invention in conjunction with the diagrammatically indicated tuner units.

In the embodiment of the invention illustrated in the drawing, a shaft 2 is rotatably mounted approximately in the center of the casing 1 of a tuner unit and supports at a location adjacent to the casing a drum 3 having two flanges 4 and 5 in which tuning spindles 6 and 7 are mounted parallel to the shaft 2. Each of the tuning spindles 6 and 7 carries a travelling nut 8 which is provided with a radially projecting arm 9. By rotation of the shaft 2 together with the drum 3, always one of the tuning spindles 6 or 7 can be moved into an operative position in which the arm 9 of the travelling nut 8 located on the respective tuning spindle disposed in its operative position comes into engagement with a tuning member 10 of the tuner unit. In the constructional example illustrated the tuning member 10 is formed by a slider member which is displaceable in the casing 1 of the tuner parallel to the shaft 2 and which is provided at its end projecting from the casing 1 with a substantially triangular abutment 11 the apex of which abuts the arm 9 of the respective tuning spindle disposed in its operative position. Consequently the slider member 10 assumes a position which depends upon the position of the travelling nut 8 of the tuning spindle and determines thereby the position of a tuning element located inside the casing 1 of the tuner unit, in particular a rotary capacitor or capacitors to which the slider member 10 is connected in a manner not illustrated in detail. Outside the casing 1 the slider member 10 is further connected to a lever arrangement 12 which is provided with an arm serving as a scale indicator 13. The scale indicator 13 engages over a front face serving as dial carrier of an angle member 14 one end of which is fixed to a side wall of the casing 1 and the other end of which is connected to a support member 15 which is mounted adjacent to the drum 3 by means of a sleeve 16 on the shaft 2 which supports the drum 3.

The shaft 2 supporting the drum 3 is provided at its outer end with a selector knob 21 which is located at a considerable spacing from the facing forward flange 5 of the drum 3 and permits rotational displacement of the shaft 2 together with the drum 3. A star wheel 22 is fixed on the shaft 2 between the drum 3 and the casing 1 and defines, in conjunction with a detent spring not illustrated in detail, a number of detent positions. In each detent position a different one of the tuning spindles 6 and 7 is in the operative position.

Furthermore, an adjuster knob 23 is rotatably mounted on the shaft 2 adjacent to the selector knob 21 and consists of a disc-shaped body member 24 with a peripheral flange 25 and a hub sleeve 26. The flange 25 projects from the body member 24 on both sides thereof and embraces on the front face of the disc 21 the selector knob 21 attached to the shaft 2. A compression coil spring 27 is disposed concentrically to the shaft 2 and is supported at the one end by the sleeve 16 of the support member 15 and at the other end by the rear end face of the hub sleeve 26 of the adjuster knob 23. The spring tends to press the adjuster knob 23 forward in the direction towards the selector knob 21 and to place the disc-shaped body member 24 of the adjuster knob against the rear face of the selector knob 21.

The support member 15 which on the one hand is connected to the angle member 14 and on the other hand is mounted by its sleeve 16 on the shaft 2 and is therefore stationary, is provided with a further support sleeve 31 which extends parallel to the shaft 2 and which is co-axial with the tuning spindle 7 located in its operative position; an adjuster shaft 32 is displaceable therein in its longitudinal direction. This adjuster shaft 32 engages by its one end into the space between the flange 25 and the hub sleeve 26 of the adjuster knob 23, and is provided in the region of this space with a gear wheel 33 which engages into a gear wheel 34 attached to the hub sleeve 26 of the adjuster knob. The rearward face of the gear wheel 34 adjacent to the drum 3 is provided with a collar 35 which engages behind the gear wheel 33 on the adjuster shaft 32 whereby this latter gear wheel is trapped between the rear side of the disc-shaped body member 24 of the adjuster knob 23 and the collar 35 of the hub sleeve 26 and must follow axial movements of the adjuster knob 23.

The other end of the adjuster shaft 32 which projects from the support sleeve 31 and faces the drum 3 is also provided at its outside with teeth 36 which mesh with a pinion 37 which is rotatable in wall parts 38 and 39 of the support member 15 about an axis parallel to the shaft 2, but which is otherwise stationary. The pinion 37 is in engagement with a further gear wheel 40 which is attached to the end of the tuning spindle 7 projecting forwardly from the drum 3. The gear wheel 40 is located opposite the facing end of the adjuster shaft 32 at a small spacing therefrom so that displacement of the adjuster shaft from the rest position illustrated in the drawing is not possible.

It is clear that rotation of the adjuster knob 23 also causes rotary motion of the adjuster shaft 32 by way of the gear wheel drive 34, 33 and that the adjuster shaft 32 in turn drives by its teeth 36 the pinion 37 which drives the gear wheel 40 on the tuning spindle 7. consequently, this tuning spindle 7 is rotated and as a result thereof the travelling nut 8 is displaced along this spindle; the nut in turn displaces by means of its arm 9 and the abutment 11 the slider member 10 which is in operative connection with tuning members in the interior of the casing of the tuner unit. In this way, therefore, the whole band which is covered by displacement of the travelling nut 8 along the tuning spindle 7 can be tuned in continuously simply by rotation of the adjuster knob 23; all transmitters lying in this band can be received and any one of these transmitters may be tuned in.

However, only the one tuning spindle 7 which is illustrated in the drawing in its operative position supports at its end projecting forwardly from the drum 3 a gear wheel 40 which comes into engagement with the pinion 37 in the operating position of the tuning spindle. All other tuning spindles 6 are provided at their ends 41 projecting from the forward flange 5 of the drum 3 with a non-circular and in particular star-shaped cross-section which may be similar to that the cross-section of a cross headed screw driver. When any of the remaining spindles 6 is located in its operative position the end 41 of such spindle is then located opposite the end of the adjuster shaft 32 at a spacing therefrom and has also a radial spacing from the pinion 37. The end face of the adjuster shaft 32 adjacent to the drum 3 is provided with a recess in a manner not illustrated in detail the cross-section of which is matched to the cross-section of the end 41 of the tuning spindles 6, so that always the end 41 of the tuning spindle 6 located in its operative position can engage fittingly into the recess in the end face of the adjuster shaft 32 when this adjuster shaft is pushed axially over the end of the respective tuning spindle 6. Displacement of the adjuster shaft 32 is effected by axial displacement of the adjuster knob 23 on the shaft 2 whereby the adjuster shaft 32 resting against the inner face of the disc-shaped body member 24 is driven and pushed on the respective tuning spindle 6 facing it dependently upon the position of the drum 3. Rotation of the adjuster knob 23 permits then again to rotate the adjuster shaft 32 by way of the gear 34, 33 the shaft 32 in turn then driving directly the associated tuning spindle 6 and thereby changing the selected channel adjustment. Upon release of the adjuster knob 23, this knob is returned into its starting position by the compression coil spring 27 referred to above. Whereas the single tuning spindle 7 serves for tuning through the whole receiving range as desired, the other tuning spindles 6 are used for storing certain adjustments. Therefore, care is taken that upon rotation of the drum 3, the tuning spindles 6 do not come into engagement with any timing members so that unintentional displacement of the selected adjustment is impossible. For changing the stored adjustments, in contrast, the adjuster knob 23 must be depressed against the force of the spring 27, and this depression is possible only with an intentional actuation of the adjuster knob 23. Only the single tuning spindle 7 for tuning through the whole band produces a driving connection between the spindle 7 and the adjuster knob 23 with the latter located in its rest position whereby a convenient tuning through the tuning range is obtained.

It is understood that the invention is not limited to the embodiment illustrated by way of example, but it can be used e.g. also in such tuning devices in which each tuning spindle is part of a potentiometer and wherein the respective potentiometer associated with the tuning spindle which is located in its operative position is inserted into a tuning circuit by means of electrical contacts.

I claim:

1. An adjusting device for a tuner unit, comprising a casing having a plurality of tuning spindles and a further tuning spindle mounted therein parallel relationship, each of said spindles having a coupling member at one end thereof, an adjuster shaft longitudinally displaceable in said casing from a rest position into an operative position and having a coupling means at an end thereof facing said coupling members, and means for producing relative movement between said spindles and said shaft such that any one of said coupling members of said spindles can be engaged by said coupling means of said adjuster shaft, said coupling members of said tuning spindles being engageable after longitudinal displacement of said adjuster shaft into said operative position thereof, and said coupling member of said further tuning spindle being arranged to be engaged while said adjuster shaft is in said rest position thereof.

2. An adjusting device according to claim 1, wherein means are provided on each of said tuning spindles permitting a selected tuning position to be set thereon by means of said adjuster shaft after displacement thereof into said operative position, and wherein means are provided on said further tuning spindle permitting tuning positions to be attained by means of said adjuster shaft in said rest position thereof.

3. An adjusting device for a tuner unit, in particular of a television receiver, having a plurality of tuning spindles which are disposed in a casing and each of which is provided at one end with a coupling member, an adjuster shaft which is displaceable in its longitudinal direction and which is provided at its end adjacent to the tuning spindles also with a coupling member which can be moved into engagement with the coupling member of an associated tuning spindle by displacement of the adjuster shaft from a rest position into an operative position, and an arrangement for producing relative movement between the adjuster shaft and the tuning spindles by means of which an association between the adjuster shaft and any desired one or the tuning spindles is produceable, characterized in that at least one further tuning spindle is provided which when the association with the adjuster shaft is produced is coupled thereto even when the adjuster shaft is located in its rest position.

4. An adjusting device according to claim 1, wherein one end of the adjuster shaft is provided with teeth which when the association with the further tuning spindle is established are in operative connection with a gear wheel mounted on the end of the further tuning spindle.

5. An adjusting device according to claim 1, wherein the adjuster shaft is disposed in line with the respective associated tuning spindle and is in operative connection with the gear wheel mounted on the end of the further tuning spindle by means of an intervening offset pinion.

6. An adjusting device according to claim 3, wherein the ends of the tuning spindles other than the end of the further tuning spindle have a non-circular, in particular star-shaped, cross-section with which they are capable of engaging in the manner of a key in a corresponding recess at the facing end of the adjuster shaft.

7. An adjusting device according to claim 3, wherein the adjuster shaft is disposed eccentrically relative to an adjuster knob and is in driving connection with the adjuster knob by means of gear wheels.

8. An adjusting device according to claim 7, wherein the edge of the adjuster knob is provided with a flange and the adjuster shaft is disposed in the region between this flange and the rotary axis of the adjuster knob.

9. An adjusting device according to claim 7, wherein the tuning spindles are disposed in a rotatable drum and the adjuster knob is mounted on the shaft of the drum, the shaft being provided with a setting knob.

* * * * *